United States Patent [19]

Roberts et al.

[11] Patent Number: 5,776,641
[45] Date of Patent: *Jul. 7, 1998

[54] METHOD OF MAKING COLOR FILTER ARRAYS BY COLORANT TRANSFER USING CHEMICAL MECHANICAL POLISHING

[75] Inventors: Luther C. Roberts, Rochester; David L. Losee, Fairport, both of N.Y.

[73] Assignee: Eastman Kodak Company, Rochester, N.Y.

[*] Notice: The term of this patent shall not extend beyond the expiration date of Pat. No. 5,756,240.

[21] Appl. No.: 787,732

[22] Filed: Jan. 24, 1997

[51] Int. Cl.$^6$ .................................................. G02B 5/20
[52] U.S. Cl. ........................... 430/7; 430/199; 503/227
[58] Field of Search .......................... 430/7, 199, 200; 503/227

[56] References Cited

U.S. PATENT DOCUMENTS

| | | | |
|---|---|---|---|
| 4,007,372 | 2/1977 | Lenhard et al. | 250/317 |
| 4,081,277 | 3/1978 | Brault et al. | 250/226 |
| 4,147,572 | 4/1979 | Vodakov et al. | 148/175 |
| 4,207,119 | 6/1980 | Tyan | 136/89 |
| 4,315,096 | 2/1982 | Tyan et al. | 136/244 |
| 4,743,463 | 5/1988 | Ronn et al. | 427/53.1 |
| 4,764,670 | 8/1988 | Pace et al. | 250/226 |
| 4,804,977 | 2/1989 | Long | 346/76 L |
| 4,876,167 | 10/1989 | Snow et al. | 430/7 |
| 4,877,697 | 10/1989 | Vollmann et al. | 430/20 |
| 4,911,733 | 3/1990 | Matsumoto | 8/471 |
| 4,923,860 | 5/1990 | Simons | 530/227 |
| 4,965,242 | 10/1990 | DeBoer et al. | 503/227 |
| 4,978,652 | 12/1990 | Simons | 503/227 |
| 5,073,534 | 12/1991 | Harrison et al. | 503/227 |
| 5,079,214 | 1/1992 | Long et al. | 503/227 |
| 5,166,126 | 11/1992 | Harrison et al. | 503/227 |
| 5,168,406 | 12/1992 | Nelson | 359/855 |
| 5,235,198 | 8/1993 | Stevens et al. | 257/232 |
| 5,252,425 | 10/1993 | Bagchi | 430/201 |
| 5,304,499 | 4/1994 | Bonnet et al. | 437/5 |
| 5,312,779 | 5/1994 | Nelson | 437/225 |
| 5,340,619 | 8/1994 | Chen et al. | 424/498 |
| 5,358,923 | 10/1994 | Mitsuhata et al. | 503/227 |
| 5,366,764 | 11/1994 | Sunthankar | 427/248.1 |
| 5,463,484 | 10/1995 | Brody | 359/68 |
| 5,521,035 | 5/1996 | Wolk et al. | 430/20 |
| 5,529,884 | 6/1996 | Tutt et al. | 430/269 |
| 5,536,333 | 7/1996 | Foote et al. | 136/260 |
| 5,538,831 | 7/1996 | Oshima et al. | 430/201 |
| 5,576,265 | 11/1996 | DeBoer et al. | 530/227 |
| 5,677,202 | 10/1997 | Hawkins et al. | 437/5 |

*Primary Examiner*—John A.m McPherson
*Attorney, Agent, or Firm*—James D. Leimbach

[57] ABSTRACT

A method of making a color filter array on a first substrate having an array of pixels, comprising the steps of: depositing and patterning a photoresist layer on the substrate layer to form selected openings over pixels in the array; providing a transferable colorant layer on a second substrate and positioning such transferable layer in transferable relationship with the first substrate; transferring the colorant material to the photoresist layer on the first substrate, removing the patterned photoresist layer by chemical mechanical polishing, leaving behind the colorant material in the position of the openings over the selected pixels.

28 Claims, 9 Drawing Sheets

METHOD OF MAKING COLOR FILTER ARRAYS BY COLORANT TRANSFER USING CHEMICAL MECHANICAL POLISHING

CROSS REFERENCE TO RELATED APPLICATIONS

The present invention is related to U.S. patent application Ser. No. 08/648,772 filed May 16, 1996 and entitled "Method of Forming an Organic Electroluminescent Display Panel," by Littman, et al., U.S. patent application Ser. No. 08/788,537 (Kodak Docket No. 75118) filed concurrently herewith, and entitled "Method for Depositing Organic Layers in Organic Light Emitting Devices," by Tang, et al., U.S. Pat. application Ser. No. 08/789,590 (Kodak Docket No. 75119) filed concurrently herewith, and entitled "Making Color Filter Arrays By Transferring Colorant Material," by Roberts, et al., U.S. patent application Ser. No. 08/788,532 (Kodak Docket No. 75120) filed concurrently herewith, and entitled "A Method Of Making A Color Filter Array By Colorant Transfer And Etch," by Roberts., and U.S. patent application Ser. No. 08/788108 (Kodak Docket No. 75121) filed concurrently herewith, and entitled "Method of Making Method of Making Color Filter Arrays By Transferring Two Or More Colorants Simultaneously," by Roberts, et al. The disclosures of these related applications are incorporated herein by reference.

FIELD OF THE INVENTION

The present invention relates to methods of making color filter arrays which are particularly suitable for use on image sensors.

BACKGROUND OF THE INVENTION

In making color filter arrays, separate layers of different colors must be formed. Frequently these layers are formed using dye as the colorant material which is imbibed into dye receiving layers which must be of a controlled thickness, and a precise amount of dye must be used to achieve the appropriate color. See, for example, commonly assigned U.S. Pat. No. 4,764,670 to Pace et al. and U.S. Pat. No. 4,876,167 to Snow et al. which describe such a process. An additional problem associated with this process is that the dye receiving layers swell upon the introduction of dyes, limiting the smallest dimension which can be attainable for use over very small pixels. Another problem with this process is that dyes are susceptible to fading on exposure to light.

Color filter arrays may also be fabricated using evaporated colorants which do not involve any receiving polymer. In order to fabricate such color filter arrays over image sensors, a typical process is as follows: A photoresist layer is coated on a semiconductor substrate such as silicon which already has an array of light receiving sites referred to in the art as pixels or photo-sites formed in the substrate. Thereafter, the substrate is patterned to form openings over the pixels or photo-sites. A colorant, generally a pigment, is then deposited over the patterned photoresist layer and, of course, forms a layer of colorant in the openings over the adhesion promoting layer. The unwanted colorant is removed by chemical mechanical polishing, in which particles of an abrasive substance such as silica with mean diameters of less than 0.5 micrometers are suspended in a fluid medium such as aqueous tetramethylammonium hydroxide and the surface to be polished is moved in relation to a pad which is wetted with the suspension. The colorant which is positioned over the selected pixels is not removed due to its lower profile relative to the surface of the unwanted colorant.

Turning to FIG. 1, which shows a method for making coatings from evaporated organic colorants: A substrate 102 is positioned adjacent to an aperture mask 104. The aperture mask provides an aperture over a portion of the substrate. An organic colorant which is to provide the coating is placed into a source boat 100, which is heated by passing an electric current through it. Alternatively, the boat may be heated by the application of radiant heating from a suitably placed heat source. Upon being heated under reduced pressure, the colorant vaporizes and travels from the source, impinging on mask 105. The portion of colorant vapor which passes through the opening in mask 105 travels along the lines 103, and between those lines, depositing on the substrate 102 and mask 104.

There are a number of problems associated with this technique which involves depositing layers in a partial vacuum and is frequently referred to in the art as physical vapor deposition (PVD). In certain cases, it is difficult to control the thickness and uniformity of the colorant disposed over the pixels. The process of vacuum deposition of the colorant typically requires the use of an appropriate placement of sources or masks or moving substrate fixtures to produce a coating which is uniform. However, the colorant material may deposit on the mask and vacuum fixtures to such a degree that it flakes off, creating undesirable contamination and waste of the colorant, and requiring frequent clean-up. In addition, the moving fixtures may generate undesirable particulate materials which may cause contamination of the substrate.

Some other problems in making color filter arrays by the PVD process are the need to use a large source-to-substrate spacing which requires large chambers and large pumps to reach a sufficient vacuum, and the need for masks which cause low-material utilization and build-up on the mask with the concomitant contamination problems. Very specific off-axis source location relative to the substrate, which is sometimes needed for uniform coating, causes very poor material utilization. Still further, source replenishment problems exist for coating multiple substrates in one pump-down. In addition, when multiple layers are deposited, the process needs to be carefully monitored for the thickness of layers in the multiple colorant coatings in multiple cycles.

SUMMARY OF THE INVENTION

It is an object of the present invention to provide an improved method for making color filter arrays which obviates the above difficulties, provides uniform colorant over the pixels, and provides low cost and high quality image sensors.

This object is achieved by a method of making a color filter array on a first substrate having an array of pixels, comprising the steps of:

a) depositing and patterning a photoresist layer on the substrate layer to form selected openings over pixels in the array;

b) providing a transferable colorant layer on a second substrate and positioning such transferable layer in transferable relationship with the first substrate;

c) transferring the colorant material to the photoresist layer on first substrate.

d) removing the patterned photoresist layer by chemical mechanical polishing, leaving behind the colorant material in the position of the openings over the selected pixels.

3

Advantages

Advantages of this technique include the removal of unwanted colorant by non-solvent means. In addition, it provides for an evaporative purification of the colorant during the preparation of the transferable colorant coating and the effective utilization of evaporant materials with high quality uniformity over a large areas. Other advantages include precise control of layer thickness, lower maintenance of deposition vacuum chambers, and minimal monitoring for the deposition process. Still further, It offers the ability to coat at higher pressures and in smaller vacuum chambers which permit faster cycle time and the use of lower-cost vacuum equipment than for standard PVD techniques.

It will be understood that the drawings are not to scale and have been shown for clarity of illustration.

DETAILED DESCRIPTION OF THE INVENTION

Figure 1:
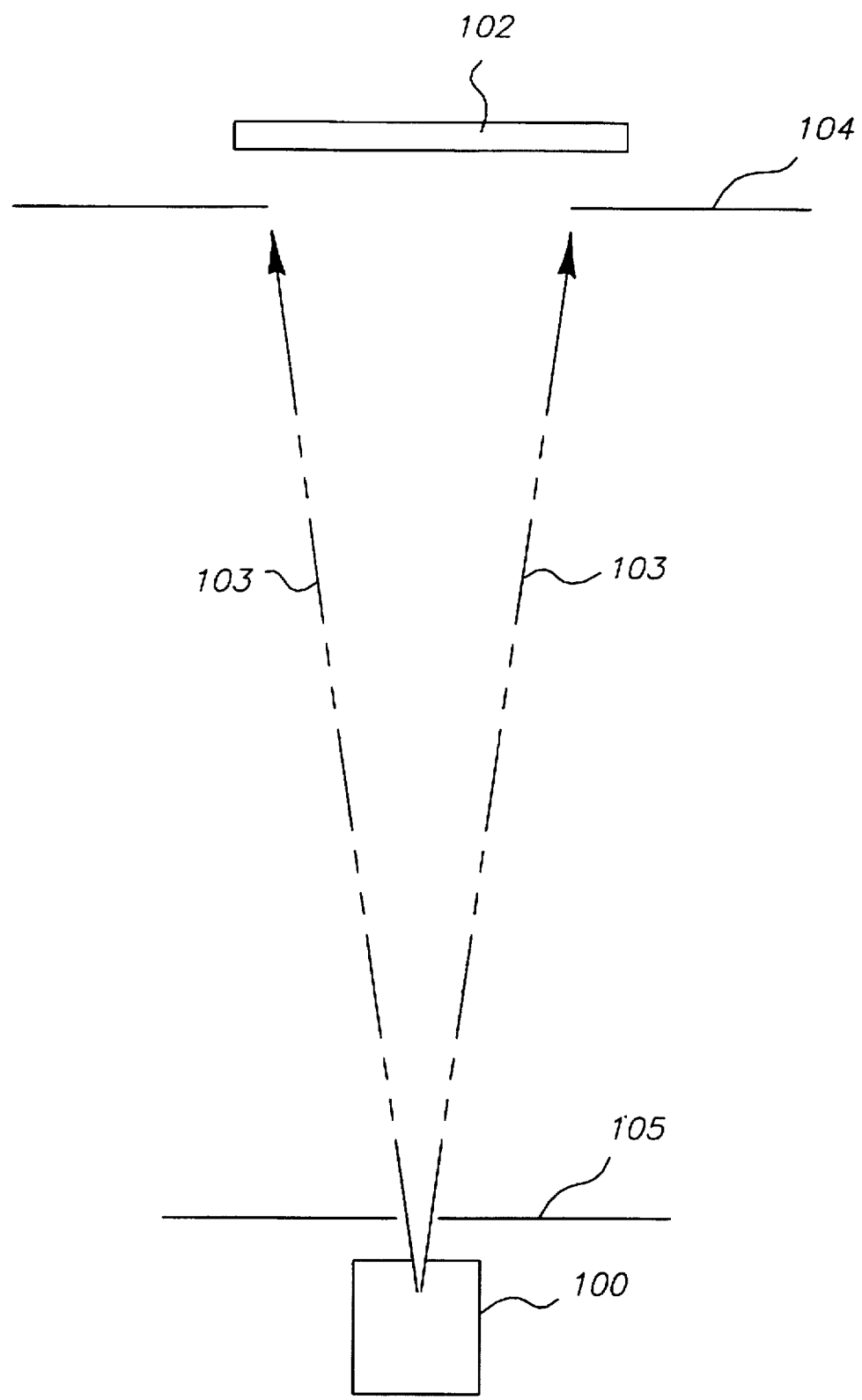
FIG. 1 shows a typical configuration for conventional physical vapor deposition (PVD).

Turning first to FIG. 1, an arrangement for conventional PVD is shown, including a heated source 100, containing the material to be deposited, the substrate 102, and masks 104 and 105 which restrict the material vapor to paths 103 and the region in between.

Figure 2:
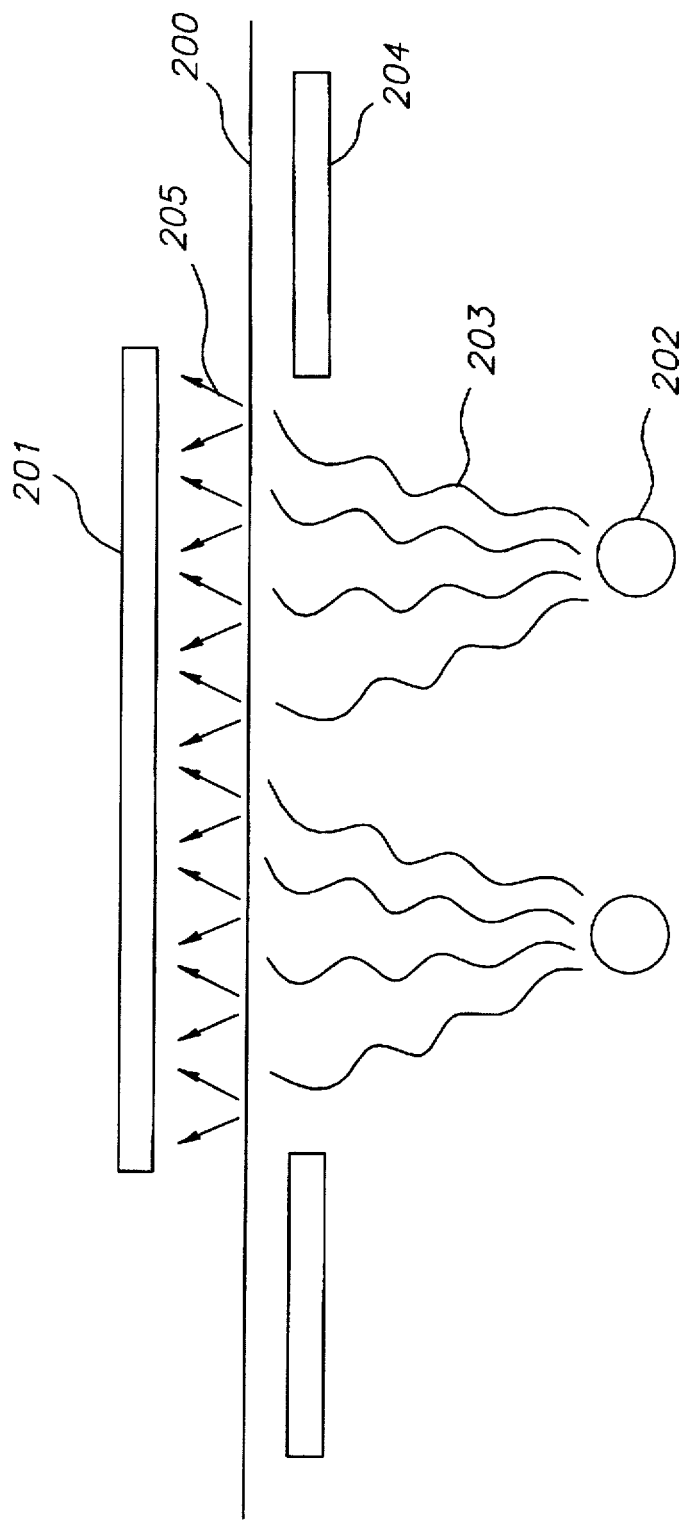
FIG. 2 shows a typical configuration for the thermal transfer of a material from an intermediate substrate to the final substrate, according to the present invention.

In FIG. 2 is shown a configuration for the transfer of a material which has been deposited as a coating on the first substrate 200, onto the second substrate 201 as indicated by the arrows 205 and which is promoted by heating with heat sources 202 as indicated by radiant heat 203 acting through an aperture 204.

Figure 3A:
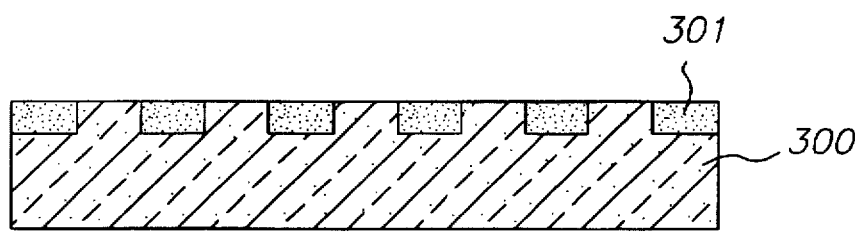
FIGS. 3A–G show various steps in a method according to the present invention for making color filter arrays.

Turning next to FIG. 3A where a silicon substrate 300 is shown, the substrate has already been processed to provide wells for different dopant materials to form pixels 301. As is well understood to those skilled in the art, the substrate may be a composite of different layers. For a more complete description of the construction of image sensors, see commonly assigned U.S. Pat. No. 5,235,198.

Figure 3B:
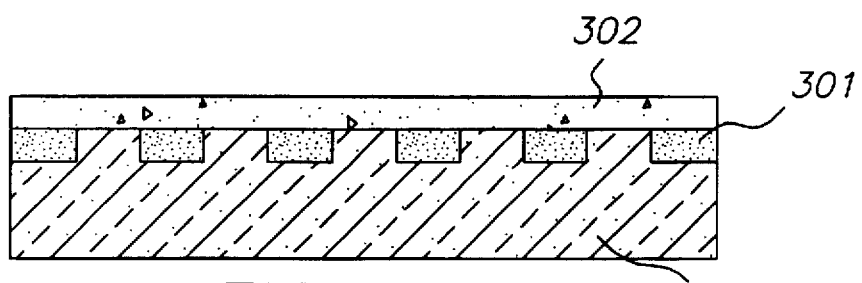

As shown in FIG. 3B, an adhesion-promoting layer 302 is formed over the surface of the substrate 300 and the pixels 301. The adhesion-promoting layer can be formed by a number of techniques including spin-coating of an organic polymer, chemical vapor deposition to form an organic layer, and spin-coating of spin-on glass. The adhesion promoting layer may be patterned to form recesses in the adhesion promoting layer above the pixels. Alternatively, the adhesion-promoting layer 302 may be applied after the photoresist layer 303, discussed below in FIG. 3C.

Figure 3C:
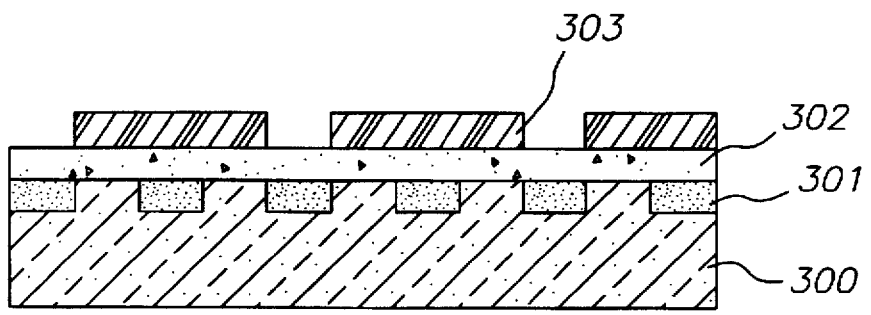

As shown in FIG. 3C, a spin-coated photoresist layer is patterned to provide openings over the pixels 301. Such patterning techniques are well known to those skilled in the art. Typically, the photoresist layer can be imagewise exposed to light, illuminating particular areas of the layer. A development step is then used to form openings over the pixels 301 providing the desired pattern.

Figure 3D:
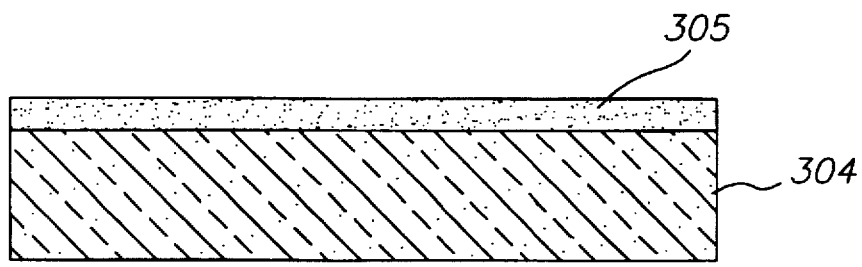

As shown in FIG. 3D, where a second substrate 304 is provided. (This substrate typically is stainless steel, but other substrate materials can be used which are heat resistant and flexible.) A layer 305 having a colorant is formed on the substrate 304. Typically, the colorant layer is formed by physical vapor deposition, which provides uniform layers of controlled thickness, containing no materials with higher volatility than the colorant. The layer 305 can be an organic colorant which is transferable upon the application of energy such as heat. In a preferred embodiment of the present invention, the colorant is vaporized by heating under reduced pressure, and condensed on a moving strip of stainless steel foil which is passed over the heated source at a constant rate.

Figure 3E:
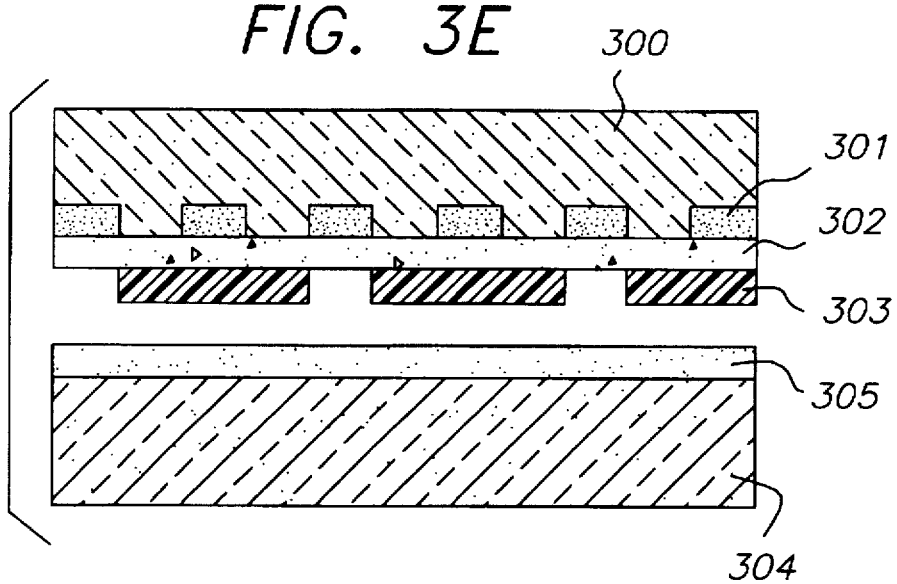
Figure 3F:
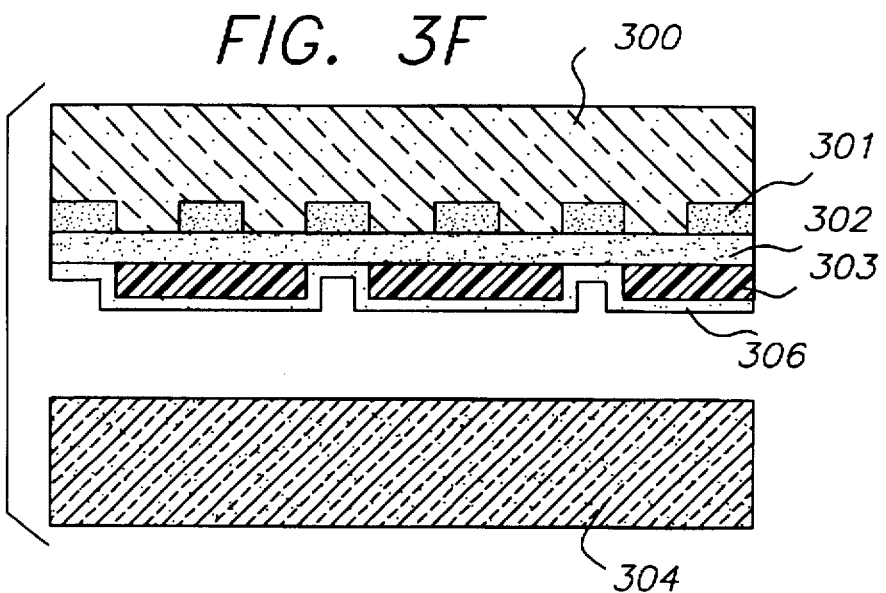

In FIG. 3E, the substrate 304 and colorant layer is shown positioned relative to the substrate 300 and the pixels 301 in the substrate. In the process it is desired to transfer the colorant layer 305 onto the substrate and the pixels. As shown in FIG. 3F the transferred colorant layer is now labeled number 306. In order to provide this transfer, heat is applied to the substrate 304. Typically, the substrate is composed of metals, such as steel or aluminum or of a temperature-resistant plastic such as a polyimide film. Heating is often done by exposing the non-coated side of the substrate 304 to electromagnetic radiation of wavelengths which are absorbed by the substrate or by the colorant coating and are converted into heat by radiationless decay processes. The electromagnetic radiation may be applied over a large area simultaneously as from an extended lamp source, or it may be applied as a scanned beam as with a laser. It is appreciated that imagewise light exposure may be used to heat and transfer only a portion of the colorant coating. Another method used to heat substrate 304 in order to transfer the colorant 305 is to pass an electric current through the substrate, particularly when the substrate used is composed entirely or partially of metal. In still another method, the substrate may be heated by direct contact with an object such as a metal block, a high temperature roller, or other such devices which can be heated or pre-heated to the required temperature and which can transfer heat to the substrate by direct thermal contact. Typical distances and pressures for the transfer of colorant are from about 0.1 mm to about 3 mm at pressures of less than or equal to about 0.1 Torr, up to a distance of about 50 mm at pressures of less than 0.001 Torr.

Figure 3G:
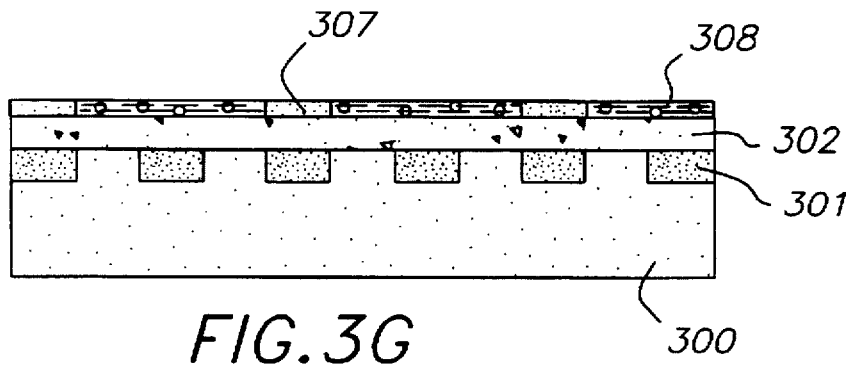

FIG. 3G shows the color filter array after a chemical mechanical polishing process. The chemical mechanical polishing process is needed to remove unwanted portions of the photoresist layer 303 and the portions of the layer 306 on the unwanted portions of the photoresist layer 303, leaving behind colorant layers 307 over the selected pixels and photoresist layer 308 over the remaining areas.

In order to make a color filter array with a plurality of colors, the above steps need to be repeated for each new colorant layer that is deposited over pixels.

Figure 4A:
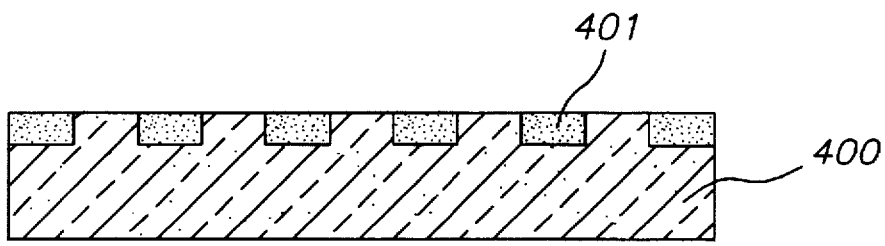
FIGS. 4A–F show various steps in another method according to the present invention for making color filter arrays.

Turning to FIG. 4A where a silicon substrate 400 is shown, the substrate has already been processed to provide wells for different dopant materials to form pixels 401. As is well understood to those skilled in the art, the term substrate includes a composite of different layers.

Figure 4B:
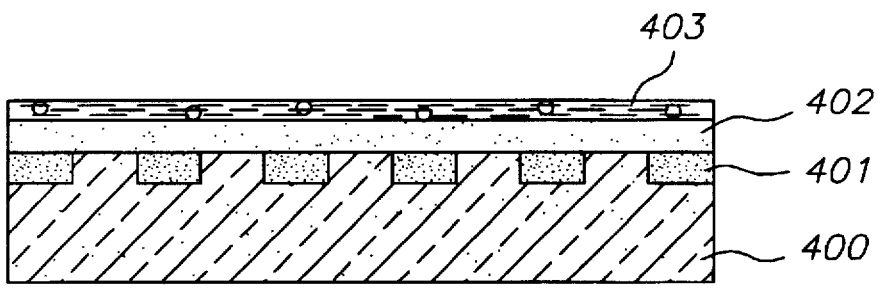

As shown in FIG. 4B, an adhesion promoting layer 402 which can be subsequently etched is formed on the substrate 400 and the pixels 401, and a layer of photoresist 403 is formed above it.

Figure 4C:
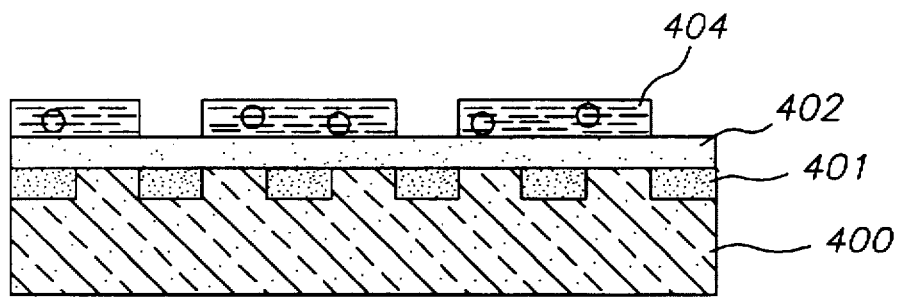

As shown in FIG. 4C, the photoresist is exposed and developed to form openings over selected pixels, leaving photoresist 404 over the rest of the layer 402.

Figure 4D:
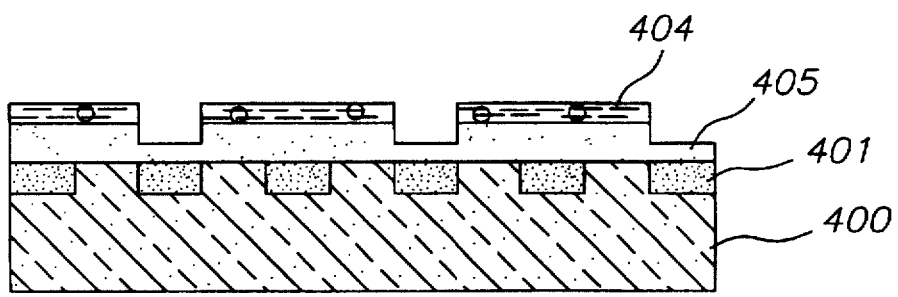

As shown in FIG. 4D, the openings in the patterned resist layer 404 are used as a mask for an etch of the underlying layer, to produce a pattern of recesses in the underlying layer, now numbered 405.

Figure 4E:
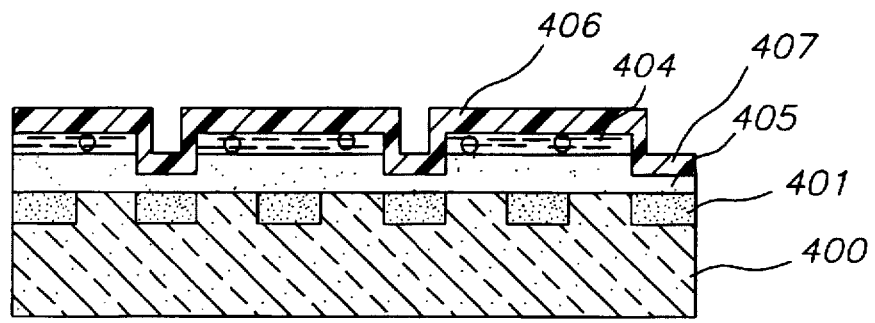

As shown in FIG. 4E, a colorant layer is deposited on the patterned resist layer 404 and the recesses in underlying layer 405 to give layer 406/407.

Figure 4F:
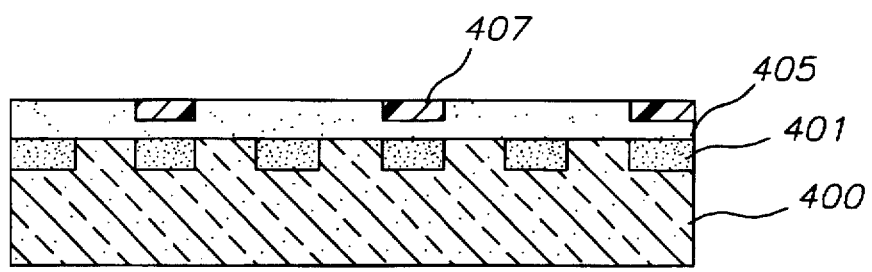

As shown in FIG. 4F, the colorant which is not above the selected pixels 406 and the patterned photoresist layer 404 are removed by chemical mechanical polishing, to leave the patterned layer 405 and the colorant above the selected pixels, 407.

In order to make a three-color filter array, the above steps need to be repeated for each new colorant layer that is deposited over subsequently selected pixels.

Figure 5A:
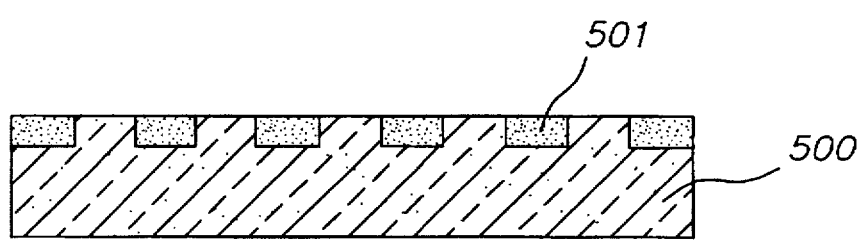
FIGS. 5A–K show various steps in a third method according to the present invention for making color filter arrays.

Turning now to FIG. 5A, in which a silicon substrate 500 is shown, the substrate has already been processed to provide wells for different dopant materials to form pixels 501. As is well understood to those skilled in the art, the substrate may be a composite of different layers.

Figure 5B:
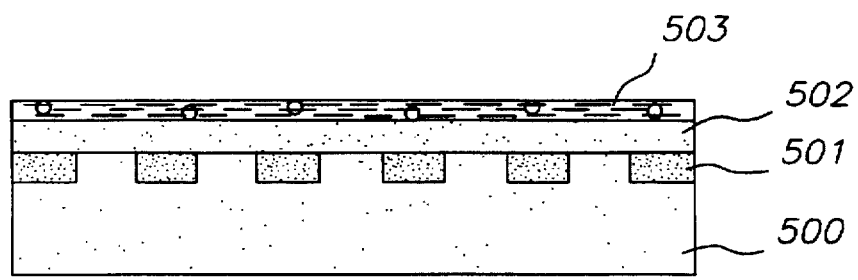

As shown in FIG. 5B, an adhesion promoting layer 502 which can be etched is formed on the substrate 500 and the pixels 501, and a photoresist layer 503 is formed above it.

Figure 5C:
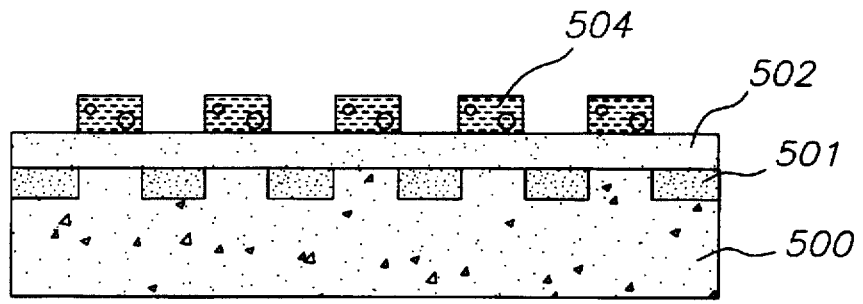

As shown in FIG. 5C, the photoresist is exposed and developed to form the patterned photoresist layer 504, having openings above all the pixels.

Figure 5D:
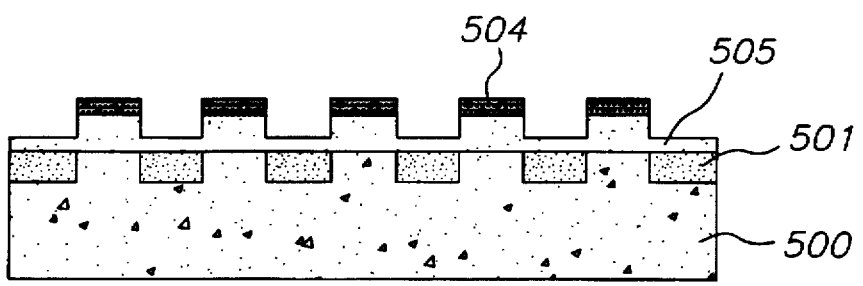

As shown in FIG. 5D, a recessed pattern is formed in underlayer 5OS by etching through the patterned photoresist layer 504 as a mask.

Figure 5E:
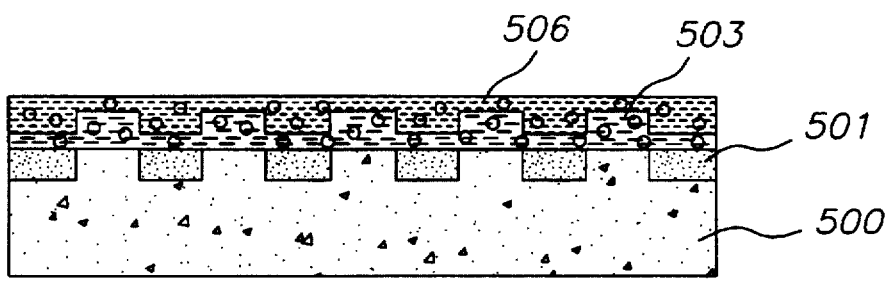

As shown in Fig. 5E, another layer of photoresist 506 is formed on the patterned layer 505.

Figure 5F:
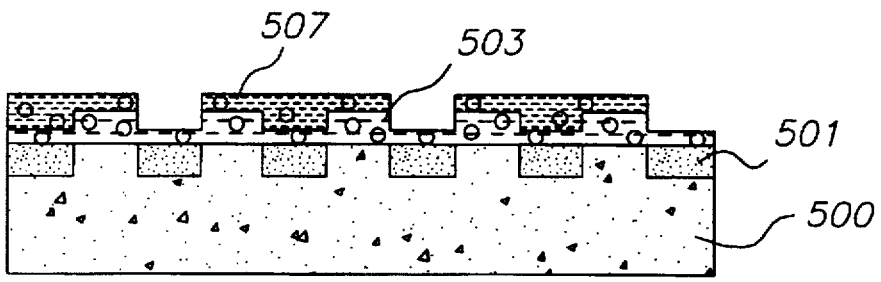

As shown in FIG. 5F, the photoresist layer is exposed and developed to form a patterned resist layer 507, with openings above first selected pixels.

Figure 5G:
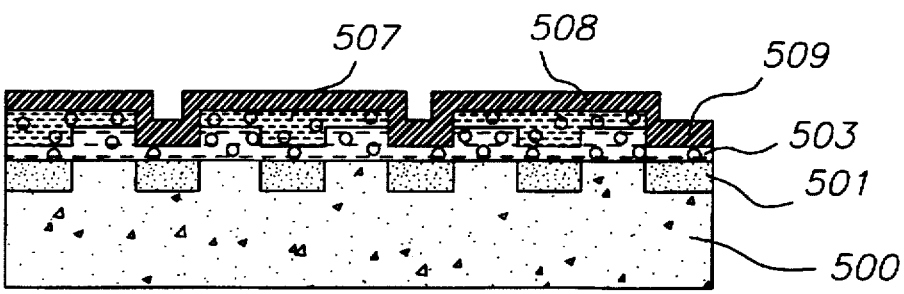

As shown in FIG. 5G, a colorant layer is deposited on the patterned resist layer 507 and above the selected pixels to give layer 508/509.

Figure 5H:
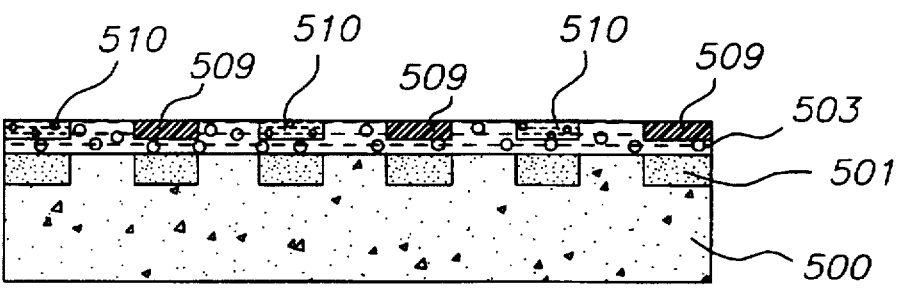

As shown in FIG. 5H, the colorant layer 508 which is not above the first selected pixels and the photoresist layer 507 are removed to leave colorant 509 above the first selected pixels, and photoresist 510 above the other pixels. Methods for removing the colorant layer and photoresist layer include chemical mechanical polishing.

Figure 5I:
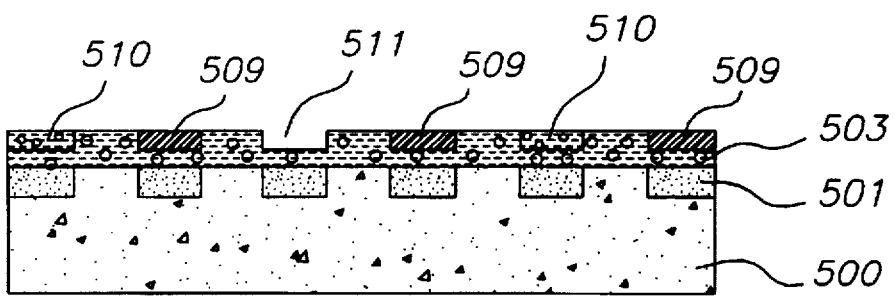

As shown in FIG. 5I, the photoresist over second selected pixels is exposed and developed to remove it from above those pixels, leaving openings 511 in the etched layer 503.

Figure 5J:
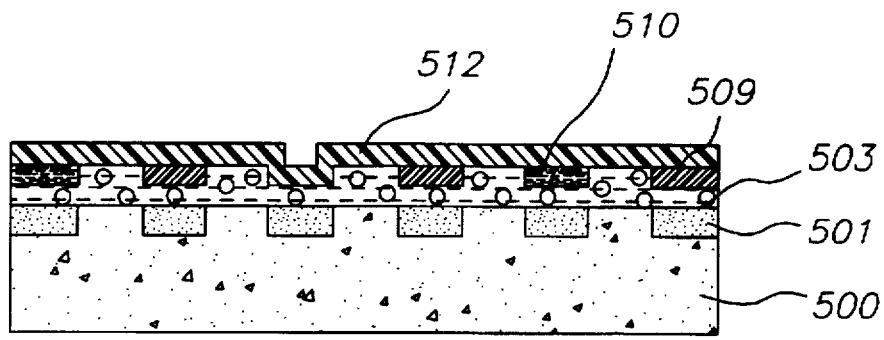

As shown in FIG. 5J, a second colorant layer 512 is deposited over the etched layer 503, the first colorant above the first selected pixels 509 and the remaining photoresist 510 above non-selected pixels.

Figure 5K:
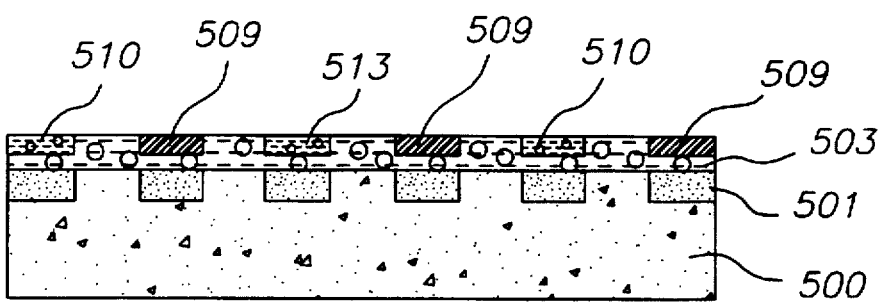

As shown in FIG. 5K, the colorant layer is removed to leave the first colorant 509 above the first selected pixels, the second colorant 513 above the second selected pixels, and photoresist 510 above the remaining pixels. Methods for removing the colorant layer include chemical mechanical polishing.

A third colorant deposit can be made above the remaining pixels by repeating the above steps used for the second deposit.

Colorants which are useful in the processes shown in FIGS. 3A–G, 4A–F and 5A–K include the following: phthalocyanines, such as Pigment Blue 15, nickel phthalocyanine, chloroaluminum phthalocyanine, hydroxy aluminum phthalocyanine, vanadyl phthalocyanine, titanyl phthalocyanine, and titanyl tetrafluorophthalocyanine; isoindolinones, such as Pigment Yellow 110 and Pigment Yellow 173; isoindolines, such as Pigment Yellow 139 and Pigment Yellow 185; benzimidazolones, such as Pigment Yellow 151, Pigment Yellow 154, Pigment Yellow 175, Pigment Yellow 194, Pigment Orange 36, Pigment Orange 62, Pigment Red 175, and Pigment Red 208; quinophthalones, such as Pigment Yellow 138; quinacridones, such as Pigment Red 122, Pigment Red 202, and Pigment Violet 19; perylenes, such as Pigment Red 123, Pigment Red 149, Pigment 179, quinophthalones, such as Pigment Yellow 138; quinacridones, such as Pigment Red 122, Pigment Red 202, and Pigment Violet 19; perylenes, such as Pigment Red 123, Pigment Red 149, Pigment 179, Pigment Red 224, and Pigment Violet 29; dioxazines, such as Pigment Violet 23; thioindigos, such as Pigment Red 88, and Pigment Violet 38; epindolidiones, such as 2,8-difluoroepindolidione; anthanthrones, such as Pigment Red 168; isoviolanthrones, such as isoviolanthrone; indanthrones, such as Pigment Blue 60; imidazobenzimidazolones, such as Pigment Yellow 192; pyrazoloquinazolones, such as Pigment Orange 67; diketopyrrolopyrroles, such as Pigment Red 254, Irgazin DPP RubinTR, Cromophtal DPP OrangeTR; Chromophtal DPP Flame Red FP (all of Ciba-Geigy); and bisaminoanthrones, such as Pigment Red 177.

EXAMPLES

In accordance with the above-stated invention, the following has been performed.

Example 1. Commercially obtained copper phthalocyanine was heated by passing electrical current through the tantalum boat which contained it, while maintaining a reduced pressure of approximately 6×10E 5 Torr in a vacuum bell jar. About 0.2 microns of phthalocyanine were deposited onto a section of stainless steel foil, having a thickness of about 25 microns. The coated foil was then mounted about 3 mm distant from a silicon wafer which had been spin-coated with about 1 micron of poly(methyl glutarimide), "PMGI" from Microelectronics Chemical Corp., and then coated with about 1.3 microns of photoresist AZ5214IR (Hoechst Celanese Corp.) which was subsequently patterned and developed, and the non-coated side of the foil was positioned about 25 mm from an array of heat lamps (General Electric, Part no. QH500T3/CL) spaced about 30 mm apart. The assembly was subjected to a vacuum of about 6×10E-5 Torr and the heat lamps were powered for 60 seconds to transfer the phthalocyanine to the silicon wafer. The water was removed from the vacuum chamber and subjected to ultrasound in a tray of acetone for 90 seconds, using a Branson Model 3200 ultrasonic bath. The photoresist was completely removed by this treatment, leaving intact the copper phthalocyanine features in the desired pattern.

Example 2. Commercially obtained copper phthalocyanine was heated by passing electrical current through the tantalum boat which contained it, while maintaining a reduced pressure of about 6×10E-5 Torr in a vacuum bell jar. About 0.2 microns of phthalocyanine were deposited onto a section of stainless steel foil, having a thickness of about 25 microns. The coated foil was then mounted about 3 mm distant from a glass substrate, and the foil was clamped between two electrodes. The assembly was subjected to a vacuum of about 0.1 Torr, and electric current was passed through the foil (at 30 volts) for about 10 sec., causing the ends of the foil to reach a temperature of about 260 degrees C and the phthalocyanine to transfer to the glass substrate.

The foregoing description as illustrated the embodiments most preferred by the inventors. While these are the best modes envisioned by the inventors obvious variations will be apparent to those skilled in the art. Therefore, the invention should not be limited to the embodiments detailed above, but should be defined by the appended claims.

| Parts List | |
|---|---|
| 100 | heat source |
| 102 | substrate |
| 103 | paths |
| 104 | mask |
| 105 | mask |
| 200 | substrate |
| 201 | substrate |
| 202 | sources |
| 203 | heat |
| 204 | aperture |
| 205 | arrows |
| 300 | substrate |
| 301 | pixels |
| 302 | layer |
| 303 | layer |
| 304 | substrate |
| 305 | layer |
| 306 | layer |
| 307 | layer |
| 308 | layer 308 |
| 400 | substrate |
| 401 | pixels |
| 402 | layer |
| 403 | photoresist |
| 404 | photoresist |
| 405 | layer |
| 406 | layer |
| 407 | layer |
| 500 | substrate |
| 501 | pixels |
| 502 | layer |
| 503 | photoresist layer |
| 504 | photoresist layer |
| 505 | underlayer |
| 506 | photoresist |
| 507 | patterned photoreist layer |
| 508 | layer |
| 509 | layer |
| 510 | photoresist |
| 511 | openings |
| 513 | colorant |

We claim:

1. A method of making a color filter array on a first substrate having an array of pixels, comprising the steps of:
   a) depositing and patterning a photoresist layer on the substrate layer to form selected openings over pixels in the array;
   b) providing a transferable colorant layer on a second substrate and positioning such transferable layer in transferable relationship with, but spaced from, the first substrate;
   c) transferring the colorant material to the photoresist layer on the first substrate,
   d) removing the patterned photoresist layer by chemical mechanical polishing, leaving behind the colorant material in the position of the openings over the selected pixels.

2. The method of claim 1 wherein the transferring step includes heating the colorant material layer to transfer it to the patterned photoresist layer.

3. The method of claim 1 further including repeating steps a)-d) for different colorant materials.

4. The method of claim 1 wherein the transferring steps are performed at pressures $\leq 0.1$ Torr.

5. The method of claim 1 wherein the transferring steps are performed at an inter-substrate distance of $\leq 50$ mm.

6. The method of claim 1 wherein the colorant material is selected from the group consisting of: phthalocyanines; isoindolinones, benzimidazolones; quinophthalones; quinacridones; perylenes; dioxazines; epindolidiones; isoviolanthrones; indanthrones; imidazobenzimidazolones; pyrazoloquinazolones; diketopyrrolopyrroles; and bisaminoanthrones.

7. A method of making a color filter array on a first substrate having an array of pixels, comprising the steps of:
   a) forming an adhesion promoting layer over the pixels in the first substrate;
   b) depositing and patterning a photoresist layer on the substrate layer to form selected openings over pixels in the array;
   c) providing a transferable colorant layer on a second substrate and positioning such transferable layer in transferable relationship with the first substrate that is spaced from the first substrate;
   d) transferring the colorant material to the first substrate layer, and
   e) removing the patterned photoresist layer by chemical mechanical polishing of the colorant layer and photoresist layers, leaving behind the colorant material in the position of the openings over the selected pixels.

8. The method of claim 7 wherein the transferring steps each include heating the colorant material layer to transfer it to the patterned photoresist layer.

9. The method of claim 7 further including repeating steps b)-e) for different colorant materials.

10. The method of claim 9 wherein the transferring steps are performed at pressures $\leq 0.1$ Torr.

11. The method of claim 7 wherein the transferring steps are performed at an inter-substrate distance of $\leq 50$ mm.

12. The method of claim 7 wherein the transferring steps are performed at pressures $\leq 0.1$ Torr and inter-substrate distances of about 0.1 mm to about 3 mm.

13. The method of claim 7 wherein the transferring steps are performed at pressures $\leq 0.001$ Torr and inter-substrate distances $\leq 50$ mm.

14. The method of claim 7 wherein the colorant material is selected from the group consisting of: phthalocyanines; isoindolinones, benzimidazolones; quinophthalones; quinacridoniesperylenes; dioxazines; epindolidiones; isoviolanthrones; indanthrones; imidazobenzimidazolones; pyrazoloquinazolones; diketopyrrolopyrroles; and bisaminoanthrones.

15. A method of making a color filter array on a first substrate having an array of pixels, comprising the steps of:
   a) forming an adhesion promoting layer over the pixels in the first substrate;
   b) depositing and patterning a photoresist layer on the substrate layer to form selected openings over pixels in the array;
   c) etching through the openings in the patterned photoresist layer into the adhesion promoting layer to form a pattern of recesses in the adhesion promoting layer;
   d) providing a transferable colorant layer on a second substrate and positioning such transferable layer in transferable relationship with the first substrate that is spaced from the first substrate;

e) transferring the colorant material to the first substrate layer, and f) removing the patterned photoresist layer and colorant layer by chemical mechanical polishing of the colorant layer and photoresist layers, leaving behind the colorant material in the position of the openings over the selected pixels.

16. The method of claim 15 wherein the transferring steps each include heating the colorant material layer to transfer it to the patterned photoresist layer.

17. The method of claim 15 further including repeating steps b)-f) for different colorant materials.

18. The method of claim 15 wherein the transferring steps are performed at pressures ≦0.1 Torr.

19. The method of claim 15 wherein the transferring steps are performed at an inter-substrate distance of ≦50 mm.

20. The method of claim 15 wherein the transferring steps are performed at pressures ≦0.001 Torr and inter-substrate distances ≦50 mm.

21. The method of claim 15 wherein the colorant material is selected from the group consisting of: phthalocyanines; isoindolinones, benzimidazolones; quinophthalones; quinacridones; perylenes; dioxazines; epindolidiones; isoviolanthrones; indanthrones; imidazobenzimidazolones; pyrazoloquinazolones; diketopyrrolopyrroles; and bisaminoanthrones.

22. A method of making a color filter array on a first substrate having an array of pixels, comprising the steps of:

a) forming an adhesion promoting layer over the pixels in the first substrate;

b) depositing and patterning a first photoresist layer on the substrate to form openings over the pixels in the array;

c) etching through the openings in the first patterned photoresist layer into the adhesion promoting layer to form a pattern of recesses in the adhesion promoting layer;

d) depositing and patterning a second photoresist layer on the substrate to form openings over first selected pixels in the array;

e) providing a transferable colorant layer on a second substrate and positioning such transferable layer in a spaced, transferable relationship with the first substrate;

f) transferring the colorant material to the first substrate, g) removing the first and second patterned photoresist layers and colorant layer by chemical mechanical polishing, leaving behind the colorant material in the position of the openings over the selected pixels, and leaving a portion of the second photoresist layer in the openings over pixels not selected;

h) exposing the second photoresist layer over second selected pixels and developing the resist to open recesses in the adhesion promoting layer over the second selected pixels;

i) providing a second transferable colorant layer on a third substrate and positioning such transferable layer in transferable relationship with the first substrate;

j) transferring the colorant material to the first substrate;

k) removing the colorant material in areas not positioned above the second selected pixels by chemical mechanical polishing;

l) exposing the second photoresist over third selected pixels and developing the resist to open recesses in the adhesion promoting layer over the third selected pixels;

m) providing a third transferable colorant layer on a fourth substrate and positioning such transferable layer in transferable relationship with the first substrate;

n) transferring the colorant material to the first substrate layer; and o) removing the colorant material in areas not positioned above the third selected pixels by chemical mechanical polishing.

23. The method of claim 22 wherein the transferring steps each include heating the colorant material layer to transfer it to the second patterned photoresist layer.

24. The method of claim 23 wherein the transferring steps are performed at pressures ≦0.1 Torr.

25. The method of claim 24 wherein the transferring steps are performed at an inter-substrate distance of ≦50 mm.

26. The method of claim 24 wherein the transferring steps are performed at pressures ≦0.1 Torr and inter-substrate distances of about 0.1 mm to about 3 mm.

27. The method of claim 24 wherein the transferring steps are performed at pressures ≦0.001 Torr and inter-substrate distances ≦50 mm.

28. The method of claim 24 wherein the colorant material is selected from the group consisting of: phthalocyanines; isoindolinones, benzimidazolones; quinophthalones; quinacridones; perylenes; dioxazines; epindolidioones; isoviolanthrones; indanthrones; imidazobenzimidazolones; pyrazoloquinazolones; diketopyrrolopyrroles; and bisaiinoanthrones.

* * * * *